United States Patent [19]

Ando

[11] 4,091,293
[45] May 23, 1978

[54] MAJORITY DECISION LOGIC CIRCUIT

[75] Inventor: Hisashige Ando, Kawasaki, Japan

[73] Assignee: Fujitsu Limited, Kawaskai, Japan

[21] Appl. No.: 750,884

[22] Filed: Dec. 15, 1976

[30] Foreign Application Priority Data

Dec. 30, 1975 Japan .............................. 50-158123
Dec. 30, 1975 Japan .............................. 50-158124

[51] Int. Cl.$^2$ ..................... H03K 19/08; H03K 19/42
[52] U.S. Cl. .................................. 307/205; 307/211; 307/215
[58] Field of Search ............... 307/205, 214, 211, 215, 307/204, 251, 242, 243, 270

[56] References Cited

U.S. PATENT DOCUMENTS

| | | | |
|---|---|---|---|
| 3,356,858 | 12/1967 | Wanlass | 307/205 |
| 3,715,603 | 2/1973 | Lerch | 307/211 |
| 3,737,673 | 6/1973 | Suzuki | 307/205 |
| 3,896,429 | 7/1975 | Moyer et al. | 340/336 |
| 3,900,742 | 8/1975 | Hampel et al. | 307/205 X |
| 3,925,685 | 12/1975 | Suzuki | 307/205 |
| 3,945,000 | 3/1976 | Suzuki et al. | 307/205 X |

OTHER PUBLICATIONS

Suzuki et al.,"Clocked CMOS Calculator Circuitry", *IEEE JSSC*, vol. SC-8, No. 6, pp. 462–469, 12/1973.

Freeman, "Complementary Voting Circuit", *IBM Tech. Discl. Bull.*, vol. 16, No. 9, pp. 2902–2903, 2/1974.

*Primary Examiner*—Larry N. Anagnos
*Attorney, Agent, or Firm*—Staas & Halsey

[57] ABSTRACT

A majority decision logic circuit has an odd number of elementary input signal circuits connected in parallel with a power source, each of the elementary input signal circuits being composed of a pair of P- and N-channel MOS transistors, the drains of the MOS transistors being interconnected to form an output terminal at the connection point and the gates being interconnected to form an input terminal at the connection point, all the output terminals of the elementary input signal circuits being connected together to form the output terminal of the majority decision logic circuit. A majority decision logic circuit has, in addition to the odd number of elementary input signal circuits, a plurality of logic circuits having their output terminals respectively connected to the input terminal of the elementary input signal circuits. A majority decision logic circuit comprises the elementary input signal circuits, the logic circuits and switching circuits, whereby the majority of outputs of a selected odd number of input signal circuits is decided. The abovesaid circuits can be formed with MOS transistors only, and are easily fabricated as an integrated circuit.

13 Claims, 7 Drawing Figures

MAJORITY DECISION LOGIC CIRCUIT

BACKGROUND OF THE INVENTION

1. Field of the Invention

This invention relates to a majority decision logic circuit employing transistors of the Metal-Oxide-Semiconductor construction, i.e. MOS transistors.

2. Description of the Prior Art

Heretofore, several kinds of circuits have been proposed for deciding the majority of the count values of a plurality of counter circuits. These conventional circuits employ, for example, a method of addition of currents utilizing resistors or magnetic fluxes by magnetic cores. They are all simple in circuit construction, but are not suitable for fabrication as integrated circuits.

Also, there has been proposed a majority decision logic circuit employing transistors and diodes, which circuit is suitable for fabrication as an integrated circuit. This circuit comprises three 2-input AND gates and one 3-input OR gate, for example, in the case of deciding the majority of three signals, and is designed to provide an output signal "1" when input signals "1" have been applied to two of the three inputs or to all of them, and to provide an output signal "0" when an input signal "1" has been applied to any one or none of the three inputs.

But since the AND gate or OR gate such as mentioned above is composed of many electronic parts, the abovesaid majority decision logic circuit has the defect of complicated circuit construction in addition to the necessity of a large number of parts, even for the majority decision of only three input signals. The circuit for the majority decision of only three input signals has such defects, and there has not been realized a circuit which has an odd number of logic circuits and is capable of deciding the majority of output signals of the logic circuits or individually picking up the outputs from the logic circuits.

SUMMARY OF THE INVENTION

An object of this invention is to provide a majority decision logic circuit which can be formed with a relatively small number of MOS transistors only, and which is highly suitable for fabrication as an integrated circuit.

Another object of this invention is to provide a majority decision logic circuit which is capable of deciding the majority of the outputs from many logic circuits, which is suitable for fabrication as an integrated circuit together with the logic circuits, and which is simple in circuit construction.

Another object of this invention is to provide a majority decision logic circuit which has a plurality of logic circuits and decides the majority of the outputs therefrom, and in which the majority of the outputs of a selected odd number of the logic circuits can be decided.

Another object of this invention is to provide a majority decision logic circuit which has a plurality of logic circuits and decides the majority of the outputs therefrom, and in which the output from a selected one of the logic circuits can be obtained.

Still another object of this invention is to provide a majority decision logic circuit which has a plurality of logic circuits and decides the majority of the outputs therefrom, and which is formed with MOS transistors alone.

Other objects, features and advantages of the present invention will hereinafter become more fully apparent from the following description taken in conjunction with the accompanying drawings, which illustrate several preferred embodiments of the invention.

DESCRIPTION OF THE PREFERRED EMBODIMENTS

Figure 1:
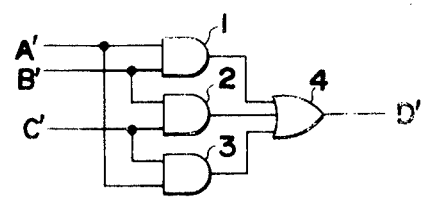
FIG. 1 is a circuit diagram showing one example of conventional majority decision logic circuits.

As a majority decision logic circuit suitable for fabrication as an ingtegrated circuit with semiconductor elements such as transistors, diodes, etc., a circuit such, for example, as shown in FIG. 1 is known which is employed for deciding the majority of three signals. The illustrated circuit is comprised of three AND gates 1 to 3, each having two inputs, and an OR gate 4 having three inputs, and is adapted to derive an output signal "1" at an output terminal D' when input signals have been applied to two or three of input terminals A', B' and C', and an output signal "0" at the output terminal D' when an input signal has been applied to any one or more of the input terminals.

But the AND gate or OR gate such as mentioned above is composed of many electronic parts, so that even for such majority decision of only three input signals, a large number of parts is required and the circuit construction is inevitably complicated.

In accordance with this invention, the majority decision logic circuit is formed with a small number of electronic parts, in particular, MOS transistors alone, and is simplified in circuit construction, and capable of performing a variety of functions in cooperation with other logic circuits. The invention will hereinafter be described in detail.

Figure 2:
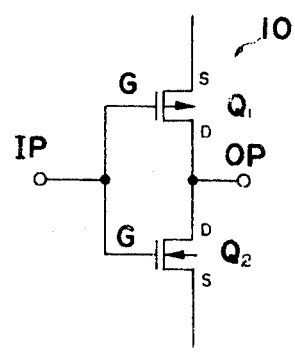
FIG. 2 is a circuit diagram illustrating an elementary input signal circuit in the majority decision logic circuit of this invention.

FIG. 2 shows an elementary input signal circuit 10 in which the drains D of a P-channel MOS transistor $Q_1$ and an N-channel MOS transistor $Q_2$ are interconnected to form an output terminal OP, and in which the gates G of the transistors are also interconnected to form an input terminal IP.

Figure 3:
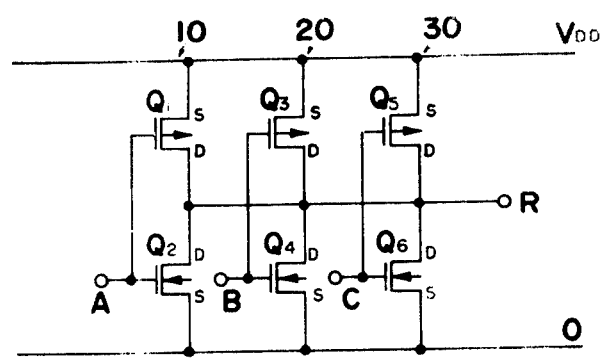
FIG. 3 is a circuit diagram showing one embodiment of the majority decision logic circuit of this invention.

FIG. 3 illustrates an embodiment of the majority decision logic circuit of this invention which employs the elementary input signal circuit 10 and elementary input signal circuits 20 and 30 identical in construction thereto. The sources S of the P-channel MOS transistors $Q_1$, $Q_3$ and $Q_5$ of the elementary input signal circuits 10, 20 and 30 are connected to a power source terminal $V_{DD}$ and the sources S of the N-channel MOS transistors $Q_2$, $Q_4$ and $Q_6$ are grounded. Further, the connection points of the drains D of the P- and N-channel MOS transistors of the elementary input signal circuits 10, 20 and 30 are interconnected to provide an output terminal R.

In the majority decision logic circuit of such a construction, shown in FIG. 3, when input terminals A, B and C are all equipotential to the power source terminal $V_{DD}$, the N-channel MOS transistors $Q_2$, $Q_4$ and $Q_6$ conduct and the P-channel MOS transistors $Q_1$, $Q_3$ and $Q_5$ do not conduct, resulting in 0 volt at the output terminal P.

Conversely, when the input terminals A, B and C are all O(V), the N-channel MOS transistors $Q_2$, $Q_4$ and $Q_6$ are non-conductive and the P-channel MOS transistors $Q_1$, $Q_3$ and $Q_5$ are conductive, with the result that the output becomes equipotential to the power source terminal $V_{DD}$.

In the case where any one of the input terminals A, B and C is equipotential to the power source terminal $V_{DD}$ and if the other remaining two input terminals have a potential of 0 volt, the N-channel MOS transistor held equipotential to the power source terminal $V_{DD}$ conducts and the other N-channel MOS transistors do not conduct.

Figure 4:
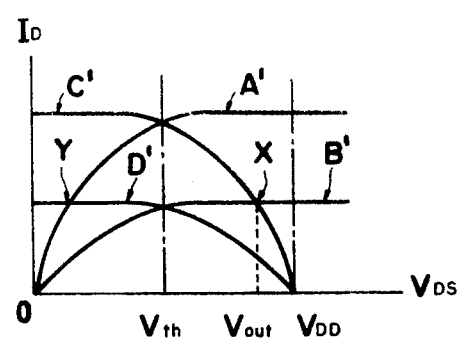
FIG. 4 is a graph explanatory of the operation of the circuit shown in FIG. 3.

The output voltage in such a case can be graphically obtained from FIG. 4.

FIG. 4 shows a $V_{DS}$-$I_D$ characteristic of the majority decision logic circuit illustrated in FIG. 3, the abscissa representing the source-drain voltage $V_{DS}$ and the ordinate the drain current $I_D$. The curve A' is a curve of operation in the case of two N-channel MOS transistors having conducted; the curve B' is a curve of operation in the case of one N-channel MOS transistor having conducted; the curve C' is a curve of operation in the case of two P-channel MOS transistors having conducted; and the curve D' is a curve of operation in the case of one P-channel MOS transistor having conducted.

In FIG. 4, the intersection X of the curves B' and C' is the output voltage produced when one N-channel MOS transistor and two P-channel MOS transistors have conducted. This voltage is a little lower than the output voltage which would be produced when all the input terminals have a potential of 0 volt (which output voltage is equipotential to the power source terminal $V_{DD}$), but is sufficiently closer to $V_{DD}$ than the threshold value ($V_{th}$ in FIG. 4) of a logic circuit using complementary MOS transistors. Accordingly, the abovesaid voltage produces the same effect as the input $V_{DD}$ in the logic circuit of the next stage, even if non-uniformity of the parts, noise, etc. are taken into consideration.

Where two of the input terminals A, B and C (FIG.3) are equipotential to the power source terminal $V_{DD}$, the output voltage shifts to the point Y, and is substantially 0 volt.

Accordingly, the input and output voltages bear the following relationship:

| Input voltage | Output voltage |
|---|---|
| All inputs O(V) | $V_{DD}$ |
| One input $V_{DD}$ | $V_{DD}$ |
| Two inputs $V_{DD}$ | 0 |
| All inputs $V_{DD}$ | 0 (V) |

If O(V) and $V_{DD}$ are taken as logic "0" and logic "1", respectively, the following relationship is obtained:

| Input | | | Output | Input | | | Output |
|---|---|---|---|---|---|---|---|
| A | B | C |  | A | B | C |  |
| 0 | 0 | 0 | 1 | 1 | 1 | 0 | 0 |
| 0 | 0 | 1 | 1 | 1 | 0 | 1 | 0 |
| 0 | 1 | 0 | 1 | 0 | 1 | 1 | 0 |
| 1 | 0 | 0 | 1 | 1 | 1 | 1 | 0 |

That is, the majority decision of inverted values of the three inputs is performed.

In the above embodiment, three elementary input signal circuits are juxtaposed and the majority decision of three signals is effected. But it is also possible to achieve the majority decision of more input signals by arranging side by side an odd number of elementary input signal circuits, for example, five, seven or the like.

Figure 5:
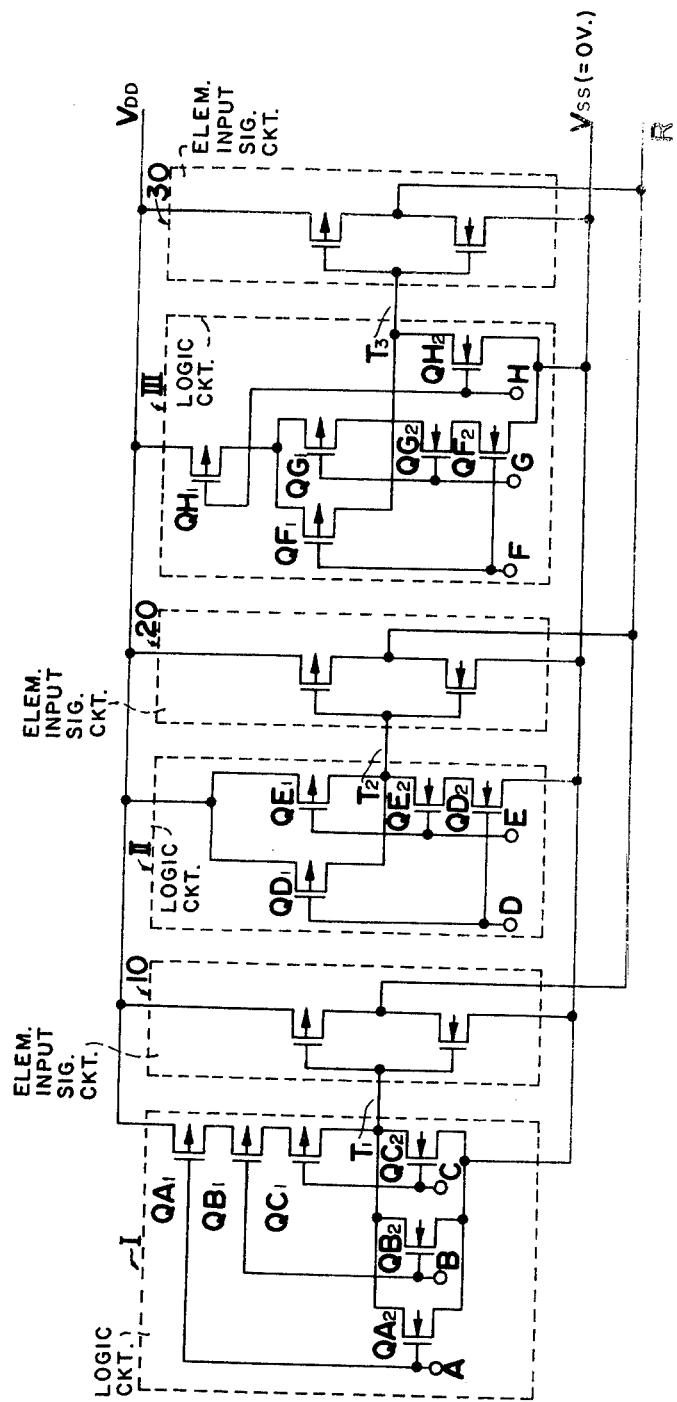
FIG. 5 is a circuit diagram illustrating another embodiment of this invention.

FIG. 5 illustrates another embodiment of this invention.

In this embodiment, since an output of the majority decision of inverted signals at input points $T_1$, $T_2$ and $T_3$ of the elementary input signal circuits 10, 20 and 30 appears at the output terminal R in exactly the same manner as in the embodiment of FIG. 3, no description will be repeated in connection with this operation.

Logic circuits I, II and III each comprise a series connection of a circuit composed of MOS transistors of one comductivity type channel and a circuit composed of the same number of MOS transistors of the other conductivity type channel as the abovesaid MOS transistors. The connection points $T_1$, $T_2$ and $T_3$ of the pairs of circuits form output terminals, and the gates of the MOS transistors of one conductivity type channel and those of the other conductivity type channel are interconnected in pairs to form input terminals. The output terminals $T_1$, $T_2$ and $T_3$ are respectively connected to the elementary input signal circuits 10, 20 and 30.

In the logic circuit I, a series circuit of P-channel MOS transistors $QA_1$, $QB_1$ and $QC_1$ and a parallel circuit of N-channel MOS transistors $QA_2$, $QB_2$ and $QC_2$ are connected in series between power source terminals $V_{DD}$ and $V_{SS}$ (=oV), and the connection point $T_1$ of the both circuits forms the output terminal as mentioned above.

On the other hand, input terminals A, B and C are respectively connected to the gates of pairs of MOS transistors $QA_1$ and $QA_2$, and $QB_2$ and $QC_1$ and $QC_2$ of opposite conductivity type channels.

The logic circuit I derives at its output terminal $T_1$ an inverted logical sum of three inputs A, B and C, that is, $\overline{A+B+C}$. Namely, if the inputs A, B and C are all "1", the P-channel MOS transistors $QA_1$, $QB_1$ and $QC_1$ are non-conductive but the N-channel MOS transistors $QA_2$, $QB_2$ and $QC_2$ conduct. When the inputs A, B and C are all "0", the P-channel MOS transistors $QA_1$, $QB_1$ and $QC_1$ conduct and the N-channel MOS transistors $QA_2$, $QB_2$ and $QC_2$ do not conduct.

Accordingly, if at least one of the inputs A, B and C is "1", at least one of the P-channel MOS transistors $QA_1$, $QB_1$ and $QC_1$ of series connection does not conduct and at least one of the N-channel MOS transistors $QA_2$, $QB_2$ and $QC_2$ conducts, making the output terminal $T_1$ equipotential to the power source terminal $V_{SS}$, i.e. "0".

Where the three inputs A, B and C are all "0", all the P-channel MOS transistors $QA_1$, $QB_1$ and $QC_1$ conduct and all the N-channel MOS transistors $QA_2$, $QB_2$ and $QC_2$ do not conduct, so that the output terminal $T_1$ becomes equipotential to the power source terminal $V_{DD}$, i.e. "1".

Also in the logic circuit II, when both inputs D and E are "1", "0" appears at the output terminal $T_2$, but when at least one of the inputs is "0", at least one of MOS transistors $QD_1$ and $QE_1$ conducts, so that "1" is derived at the output terminal $T_2$. In other words, $\overline{D \cdot E}$ (an inversion of the logical product of the two inputs D and E) is obtained.

The logic circuit III produces at its output terminal $T_3$ an inverted output of the logical sum of the logical product of two of three inputs F, G and H, i.e. $\overline{F \cdot G + H}$. Since construction and operation of the logic circuit III are similar to the abovesaid logic circuits I and II, no description will be given.

Figure 6:
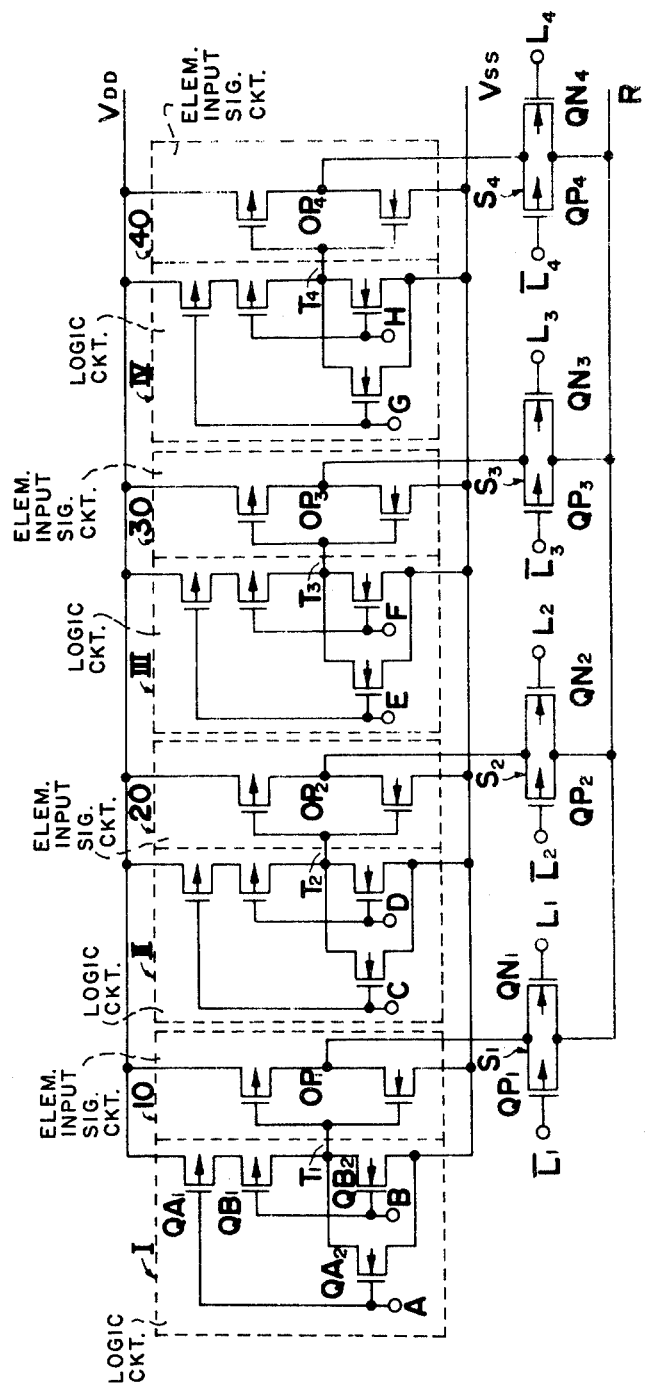
FIG. 6 is a circuit diagram showing another embodiment of the majority decision logic circuit of this invention which has a majority deciding function and a selecting function.

FIG. 6 illustrates another embodiment of the majority decision logic circuit of this invention.

The present embodiment also comprises logic circuits I, II, III and IV, each composed of MOS transistors, and elementary input signal circuits 10, 20, 30 and 40 respectively supplied with inputs from output terminals $T_1$, $T_2$, $T_3$ and $T_4$ of the logic circuits I, II, III and IV, as is the case with the FIG. 5 embodiment. Output terminals $OP_1$, $OP_2$, $OP_3$ and $OP_4$ of the elementary input circuits 10, 20, 30 and 40 are connected to the output terminal R of the majority decision logic circuit through switching circuits $S_1$, $S_2$, $S_3$ and $S_4$, respectively.

The switching circuits $S_1$, $S_2$, $S_3$ and $S_4$ are respectively formed with parallel connections of P- and N-channel MOS transistors $QP_1$ and $QN_1$, $QP_2$ and $QN_2$, $QP_3$ and $QN_3$, and $QP_4$ and $QN_4$. And the switching circuits $S_1$, $S_2$, $S_3$ and $S_4$ are respectively turned on and off by applying signals "0" and "1" or "1" and "0" to the gates of the pair of MOS transistors through pairs of terminals $L_1$ and $\overline{L}_1$, $L_2$ and $\overline{L}_2$, $L_3$ and $\overline{L}_3$, and $\overline{L}_4$ and $L_4$.

The logic circuit I is composed of a series connection of a series circuit of two P-channel MOS transistors $QA_1$ and $QB_1$ and a parallel circuit of two N-channel MOS transistors $QA_2$ and $QB_2$, and the connection point $T_1$ of the two circuits serves as the output terminal. Further, the logic circuit I has two input terminals A and B, one input terminal A being connected to the gates of the P-channel MOS transistor $QA_1$ and the N-channel MOS transistor $QA_2$, and the other input terminal B being connected to the gates of the P-channel MOS transistor $QB_1$ and the N-channel MOS transistor $QB_2$.

In the logic circuit I, when at least one of the two inputs A and B is "1", at least one of the MOS transistors $QA_2$ and $QB_2$ conducts and at least on of the MOS transistors $QA_1$ and $QB_1$ does not conduct, so that "0" is derived at the output terminal $T_1$. When the inputs A and B are both "0", the MOS transistors $QA_1$ and $QB_1$ both become conductive and the other MOS transistors $QA_2$ and $QB_2$ remain non-conductive, providing "1" at the output terminal $T_1$. In other words, for the inputs A and B, an output $\overline{A+B}$, that is, an inversion of the logical sum of the inputs, appears at the output terminal $T_1$. The logic circuit I forms a NOR circuit.

In the present embodiment, the logic circuits I, II, III and IV are all exactly identical in construction. Now, if a selected odd number of the switching circuits, for example, $S_1$, $S_2$ and $S_3$, are turned on and if the remaining switching circuit $S_4$ is turned off, it is possible to obtain, at the output terminal R, a majority decision output of inverted signals of the outputs of the logic circuits I, II, and III.

Further, if one of the switching circuits, for example, $S_1$, is selectively turned on and the others ($S_2$, $S_3$ and $S_4$) off, the output of only the logic circuit I for the switching circuit $S_1$ can be obtained at the output terminal R. In this case, however, since the output terminal $T_1$ of the logic circuit I is inverted by the elementary input signal circuit 10, the logical sum of the two inputs A and B appears at the output terminal R.

Figure 7:
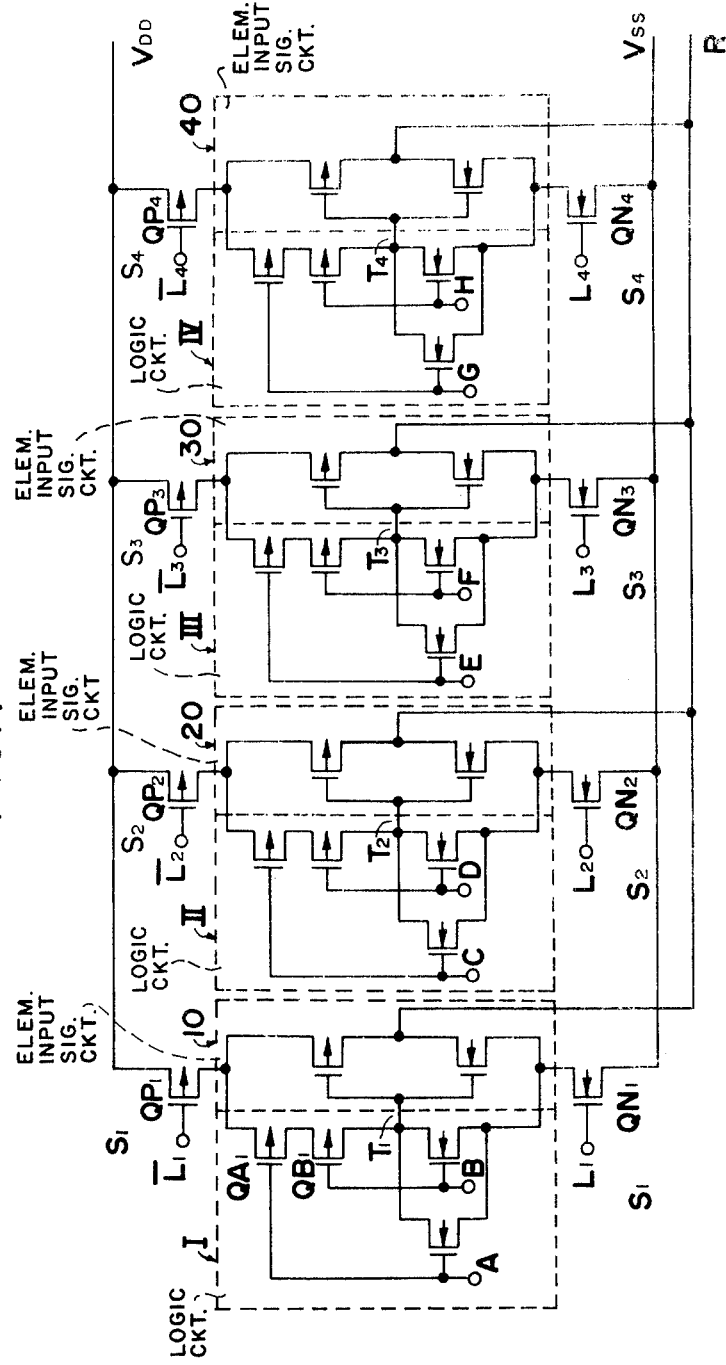
FIG. 7 is a circuit diagram illustrating a modified form of the majority decision logic circuit shown in FIG. 6.

FIG. 7 shows a further embodiment of the majority decision logic circuit of this invention.

The present embodiment of this invention is also comprised of logic circuits I, II, III and IV, each composed of MOS transistors, and elementary input signal circuits 10, 20, 30 and 40 respectively supplied with inputs from output terminals $T_1$, $T_2$, $T_3$ and $T_4$ of the logic circuits. The logic circuits and the elementary input signal circuits interconnected in pairs (I and 10, II and 20, III and 30, and IV and 40) are respectively connected to the power source terminals $V_{DD}$ and $V_{SS}$ through pairs of P- and N-channel MOS transistors $QP_1$ and $QN_1$, $QP_2$ and $QN_2$, $QP_3$ and $QN_3$, and $QP_4$ and $QN_4$. And, by applying signals "0" and "1" or "1" and "0" to the gates of the pairs of MOS transistors through pairs of terminals $\overline{L}_1$ and $L_1$, $\overline{L}_2$ and $L_2$, $\overline{L}_3$ and $L_3$, and $\overline{L}_4$ and $L_4$, respectively, the abovesaid MOS transistors are driven to perform the switching operation of supplying or cutting off the power to the corresponding pairs of logic circuits and elementary input signal circuits.

Since the construction and operation of the logic circuits I, II, III and IV and their operation associated with the elementary input signal circuits connected thereto are exactly the same as those described previously with regard to the logic circuit I in FIG. 6 no description will be repeated.

In the above, the switching circuits $S_1$, $S_2$, $S_3$ and $S_4$ are respectively formed with the pairs of MOS transistors $QP_1$ and $QN_1$, $QP_2$ and $QN_2$, $QP_3$ and $QN_3$, and $QP_4$ and $QN_4$.

Now, let it be assumed that inputs "0" and "1" are applied selectively to the pairs of terminals $\overline{L}_1$ and $L_1$, $\overline{L}_2$ and $L_2$, and $\overline{L}_3$ and $L_3$ and that inputs "1" and "0" is applied to the remaining pair of terminals $\overline{L}_4$ and $L_4$, and that the switching circuits $S_1$, $S_2$ and $S_3$ are turned on and $S_4$ off.

The logic circuits I, II and III and the elementary input signal circuits 10, 20 and 30, corresponding to the switching circuits $S_1$, $S_2$ and $S_3$ turned on, are connected to the power source and activated to provide at the output terminal R the majority decision output of the outputs from the logic circuits I, II and III, as previously described with respect to FIGS. 5 and 6. Since the switching circuit $S_4$ is in the off state, the logic circuit IV and the elementary input signal circuit 40 are non-activated and no output is produced therefrom.

Also, if one of the four switching circuits, for example, $S_1$, is turned on and the others ($S_2$, $S_3$ and $S_4$) are turned off, the output from the logic circuit I alone, activated by the switching circuit $S_1$, can be derived at the output terminal R.

Also in this case, since the output at the output terminal $T_1$ of the logic circuit I is inverted by the elementary input singnal circuit 10 as in the case of FIG. 6, the logical sum of two inputs A and B, i.e. A+B, appears at the output terminal R.

In the embodiment shown in FIG. 7, no current flows in the non-selected logic circuit and elementary input signal circuit, so that power is saved by that.

Numerous changes may be made in the above described circuits and different embodiments of the invention may be made without departing from the spirit thereof; therefore, it is intended that all matter contained in the foregoing description and in the accompanying drawings shall be interpreted as illustrative and not in a limiting sense.

What is claimed is:

1. A majority decision logic circuit for deciding the majority of a selected number of logic conditions, comprising:
   a plurality of elementary input signal circuits, each elementary input signal circuit having an input and an output and comprising one MOS transistor of one conductivity type and another MOS transistor of another conductivity type, one electrode of each of said one and said another MOS transistors being connected together to form a first connection point comprising the output terminal of said each elementary input signal circuit, said one and said another MOS transistors each having a corresponding gate electrode interconnected to form a second connection point comprising the input terminal of said each elementary input signal circuit, said one and said another MOS transistors having further electrodes connected to a power source so as to connect all the elementary input signal circuits in parallel thereto, the output terminals of all the elementary input signal circuits being connected together to form a third connection point comprising an output of the majority decision circuit;
   a plurality of logic circuits, one for each corresponding elementary input signal circuit, connected in parallel to said power source, each logic circuit comprising a first circuit including a series connection of a given number of MOS transistors of said one conductivity type, and a second circuit in series with said first circuit and including the same given number of MOS transistors and of said other conductivity type, said first and second circuits having respective output terminals connected together to form a fourth connection point comprising the output terminal of said each logic circuit, each MOS transistor of said first circuit having a gate electrode connected to a gate electrode of a corresponding MOS transistor of said second circuit to form a fifth connection point comprising an input terminal of said each logic circuit, the plurality of input terminals of said plurality of logic circuits comprising the input of said majority decision circuit;
   connecting means, one for each logic circuit, for connecting each respective output terminal of said each logic circuit to the input terminal of said corresponding elementary input signal circuit; and
   switching circuit means, one for each elementary input signal circuit, and connected for selectively activating only an odd number of said output terminals of said elementary input signal circuits.

2. The majority decision logic circuit according to claim 1, wherein the switching circuit means each comprise a MOS transistor of said one conductivity type and a MOS transistor of said other conductivity type, and the MOS transistor are each controlled to be selectively turned on and off, respectively, simultaneously.

3. The majority decision logic circuit according to claim 2, wherein the switching circuit means are each connected between said power source and said corresponding further electrodes of the elementary input signal circuits for selectively turning on and off the power source to activate the elementary input signal circuits.

4. The majority decision logic circuit according to claim 2, wherein the switching circuit means are each connected between said power source and said corresponding further electrodes of the elementary input signal circuits for selectively turning on and off the power source to activate the elementary input signal circuits, and between said power source and the logic circuits for selectively activating the logic circuits at the same time.

5. The majority decision logic circuit according to claim 2, wherein the switching circuit means are each connected to respective output terminals of the elementary input signal circuits for selectively turning on and off the output terminals thereof.

6. A majority decision logic circuit comprising:
   a plurality of elementary input signal circuits, each elemental elementary input signal circuit including a pair of MOS transistors of opposite conductivity types, a first one of said pair of MOS transistors of opposite conductivity types having one electrode interconnected to a corresponding electrode of a second one of said pair of MOS transistors of opposite conductivity types to form a first connection point defining an output terminal of said each elementary input signal circuit, said respective first connection points being connected to form a common majority circuit output terminal, said first one of said pair of MOS transistors of opposite conductivity types having a gate electrode interconnected to a corresponding gate electrode of said second one of said pair of MOS transistors of opposite conductivity types to form a second connection point defining an input terminal of said each elementary input signal circuit;
   a plurality of logic circuits, one for each elementary input signal circuit, connected in parallel to a power source, each of said logic circuits comprising a series connection of a first circuit including a first plurality of MOS transistors and a second circuit including a second plurality of MOS transistors, said first plurality of MOS transistors being equal in number and opposite in conductivity type to said second plurality of MOS transistors, the series connection between said first and second circuits forming an output terminal of said each of said logic circuits, each MOS transistor of said first circuit having a gate electrode connected to a corresponding gate electrode of a corresponding one of said MOS transistors of said second circuit to form a third connection point defining a respective input terminal of said logic circuit; and
   connecting means, one for each logic circuit, for connecting each respective output terminal of said each logic circuit to the input terminal of a corresponding one of said elementary input signal circuits.

7. The majority decision logic circuit according to claim 6, further including switching means, one for each elementary input signal circuit, and connected to the respective output terminal thereof for selectively activating only an odd number of said output terminals of said elementary input signal circuits.

8. The majority decision logic circuit according to claim 7, wherein the switching means each comprise a pair of MOS transistors of opposite conductivity types, said MOS transistors each being controlled simultaneously to respective on and off conditions.

9. The majority decision logic circuit according to claim 8, wherein each respective switching circuit means is connected to the output terminal of a corresponding one of the elementary input signal circuits for selectively turning on and off the output terminals thereof.

10. The majority decision logic circuit according to claim 6, wherein each elementary input signal circuit has a further electrode, and further including switching circuit means connected between said power source and said further electrode of corresponding said elementary input signal circuit for turning on and off the power source to activate the corresponding said elementary input signal circuit.

11. The majority decision logic circuit according to claim 10, wherein the switching circuit means each comprise a pair of MOS transistors of opposite conductivity types, said MOS transistors each being controlled simultaneously to respective on and off conditions.

12. The majority decision logic circuit according to claim 6, wherein each elementary input signal circuit has a further electrode, and further including switching circuit means connected between said power source and said further electrode of corresponding said elementary input signal circuit for turning on and off the power source to activate corresponding said elementary input signal circuit, and wherein each respective switching circuit means is further connected between said power source and a corresponding one of said logic circuits for activating the corresponding one of the logic circuits simultaneously.

13. The majority decision logic circuit according to claim 12, wherein the switching circuit means each comprise a pair of MOS transistors of opposite conductivity types, said MOS transistors each being controlled simultaneously to respective on and off conditions.

* * * * *

UNITED STATES PATENT AND TRADEMARK OFFICE
CERTIFICATE OF CORRECTION

PATENT NO. : 4,091,293

DATED : May 23, 1978

INVENTOR(S) : Hisashige Ando

It is certified that error appears in the above–identified patent and that said Letters Patent are hereby corrected as shown below:

Column 2, line 30, "ingtegrated" should be --integrated--.
Column 3, line 11, "P" should be --R--.
Column 5, line 51, "on" should be --one--.

Signed and Sealed this

Twenty-eighth Day of November 1978

[SEAL]

Attest:

RUTH C. MASON
*Attesting Officer*

DONALD W. BANNER
*Commissioner of Patents and Trademarks*